United States Patent [19]

Bradley, III et al.

[11] Patent Number: 5,429,293

[45] Date of Patent: Jul. 4, 1995

[54] SOLDERING PROCESS

[75] Inventors: Edwin L. Bradley, III, Sunrise; Kingshuk Banerji, Plantation; Vahid Kazem-Goudarzi, Sunrise, all of Fla.

[73] Assignee: Motorola, Inc., Schaumburg, Ill.

[21] Appl. No.: 358,295

[22] Filed: Dec. 19, 1994

[51] Int. Cl.⁶ .................................. H05K 3/34
[52] U.S. Cl. .................. 228/180.22; 228/248.1; 228/254; 427/123
[58] Field of Search ............. 228/180.21, 180.22, 228/208, 248.1, 248.5, 254; 427/96, 123, 383.7, 405

[56] References Cited

U.S. PATENT DOCUMENTS

| | | | |
|---|---|---|---|
| 5,024,372 | 6/1991 | Altman et al. | 228/248 |
| 5,154,341 | 10/1992 | Melton et al. | 228/180.2 |
| 5,233,504 | 8/1993 | Melton et al. | 361/760 |

FOREIGN PATENT DOCUMENTS

| | | | |
|---|---|---|---|
| 1077727 | 3/1984 | U.S.S.R. | 228/248.1 |
| 1118494 | 10/1984 | U.S.S.R. | 228/248.1 |

OTHER PUBLICATIONS

"New Techniques Eliminate Solder Paste From Printed Circuit Assembly Operation," Holzmann, D. and Payne, B., Mask Technology, Inc., Santa Ana, Calif., Surface Mount International Conference and Exposition, Proceedings of the Technical Program, San Jose, Calif., Sep., 1992.

"SIPAD—A New Reflow Soldering Method for SMD's using a Solid Solder Deposit," Maiwald, W., Siemens AG, Munich, Germany, Surface Mount International Conference and Exposition, Proceedings of the Technical Program, San Jose, Calif., Aug. 1991.

*Primary Examiner*—Samuel M. Heinrich
*Attorney, Agent, or Firm*—Dale W. Dorinski

[57] ABSTRACT

A soldering process uses two or more different solder alloys. A first solder alloy (115) that undergoes a solid-to-liquid transition at a first temperature is coated (20) onto the solderable surfaces (105) of a printed circuit board (100). A solder paste (120) that undergoes this solid-to-liquid transition at a temperature greater than the first temperature is deposited on the coated solderable potions, and is heated to a temperature that is above the first temperature but below the second temperature. During this time, the first solder alloy liquifies, while the solder paste does not. The first solder alloy wets to the individual particles in the solder paste, and alloys to the solderable surfaces and the solder particles in the solder paste. The soldering composition is subsequently cooled (40) to solidify the first solder material, forming a solid and substantially planar coating on the solderable potions of the printed circuit board.

9 Claims, 3 Drawing Sheets

SOLDERING PROCESS

CROSS REFERENCE TO RELATED APPLICATIONS

This application is related to patent application Ser. No. 08/236,611 entitled "Soldering Process" by Vahid Kazem-Goudarzi, Henry F. Liebman, Kingshuk Banerji, Edwin L. Bradley, III and William B. Mullen, III, filed on May 2, 1994, and assigned to Motorola, Inc.

TECHNICAL FIELD

This invention relates in general to a method of soldering and more particularly to a method of soldering utilizing solder materials having more than one melting temperature.

BACKGROUND

Soft solder is a fusible alloy, typically consisting of tin and lead, which is used for the purpose of joining together two or more metals at temperatures below their melting points. In addition to tin and lead, solders may occasionally contain varying amounts of other materials, such as antimony, bismuth, cadmium, indium or silver, which are typically added for the purpose of varying the physical properties of the alloy. However, in many solders, some of these elements, notably antimony, are only present as impurities. Solder is widely used in the electronics industry for attaching electrical components to printed circuit boards. Printed circuit boards typically have an electrical conductor pattern consisting of a thin metal sheet, etched to form the pattern. In order to successfully attach the electrical components to the printed circuit board, there must be a metallurgical affinity between the two metals that are going to be soldered together, the metals should be free from contamination, there must be complete and adequate metallic contact between the solder and the metals that are to be soldered, and there must be a temperature adequate for sufficient alloying of the metal. The solder provides the attachment by virtue of an intermetallic solution, which takes place at the soldering temperature.

One technique used to assemble electronic assemblies is to screen print a solder paste, (consisting of flux, vehicle, and alloy), onto the board, place the component in the wet solder paste, and then reflow the solder paste to join the component to the PCB. However, screen printing lacks the flexibility required in today's build-to-order assembly factories, and results in solder voids after reflow, degrading the solder joint strength.

Another method of assembling electronic assemblies is by a process known as solder cladding or solid solder deposition. This is done by screen printing and reflowing a solder paste on the solderable surfaces of a printed circuit board (PCB) during the PCB fabrication. The advantage of this method is that the electronic components can then be placed directly on the PCB, without having to print solder paste. One of the disadvantages of this method is that the solder that is clad onto the PCB results in a highly domed surface on the solder pads that degrades the accuracy of component placement. The parts and flux tend to slide off of the domed surface when they are placed, and while the circuit board is subjected to accelerations moving down the assembly line. Some have attempted to solve this problem by reducing the amount of solder clad onto the solder pad, thus decreasing the curvature of the domed surface. However, reducing the volume of solder decreases the total wetting forces of the solder, reducing the desirable tendency of the components to self-center during the assembly reflow operation. This self-centering tendency is extremely important to assure accurate alignment and high-yield soldering. In addition, it is desirable to maximize the amount of solder deposited on the board during the cladding process in order to create a full solder fillet between the component and the PCB. Still others have attempted to eliminate the domed pads by flattening the pad after the solder is deposited, as in the OPTIMASK® method developed by DuPont and the SIPAD process developed by Siemens AG. In both cases, additional steps of flattening the domed pad are required.

Clearly, it would be a benefit to the electronics industry if a method of soldering could be devised that includes the advantages of both solder cladding and solder printing, but avoids the disadvantages of both processes.

SUMMARY OF THE INVENTION

Briefly, according to the invention, a soldering process using two or more different solder alloys is disclosed. A first solder alloy that undergoes a solid-to-liquid transition at a first temperature is coated onto the solderable surfaces of a printed circuit board. A solder paste made from solder particles that undergo this solid-to-liquid transition at a temperature greater than the first temperature is deposited on the coated solderable portions, and is heated to a temperature that is above the first temperature but below the second temperature. During this time, the first solder alloy liquifies, while the solder particles in the paste do not. The first solder alloy wets to the individual particles in the solder paste, and alloys to the solderable surfaces on the printed circuit board and the solder particles. The soldering composition is subsequently cooled to solidify the first solder material, forming a solid and substantially planar coating on the solderable portions of the printed circuit board.

In alternate embodiments of the invention, a part or electronic component is added to the solidified planar solder coating, and the solder material is heated to melt the entire solder deposit and form a metallurgical bond to the part.

And in still further embodiments, a flux is used during the process of soldering the part to the board.

DETAILED DESCRIPTION OF THE PREFERRED EMBODIMENT

Figure 1:
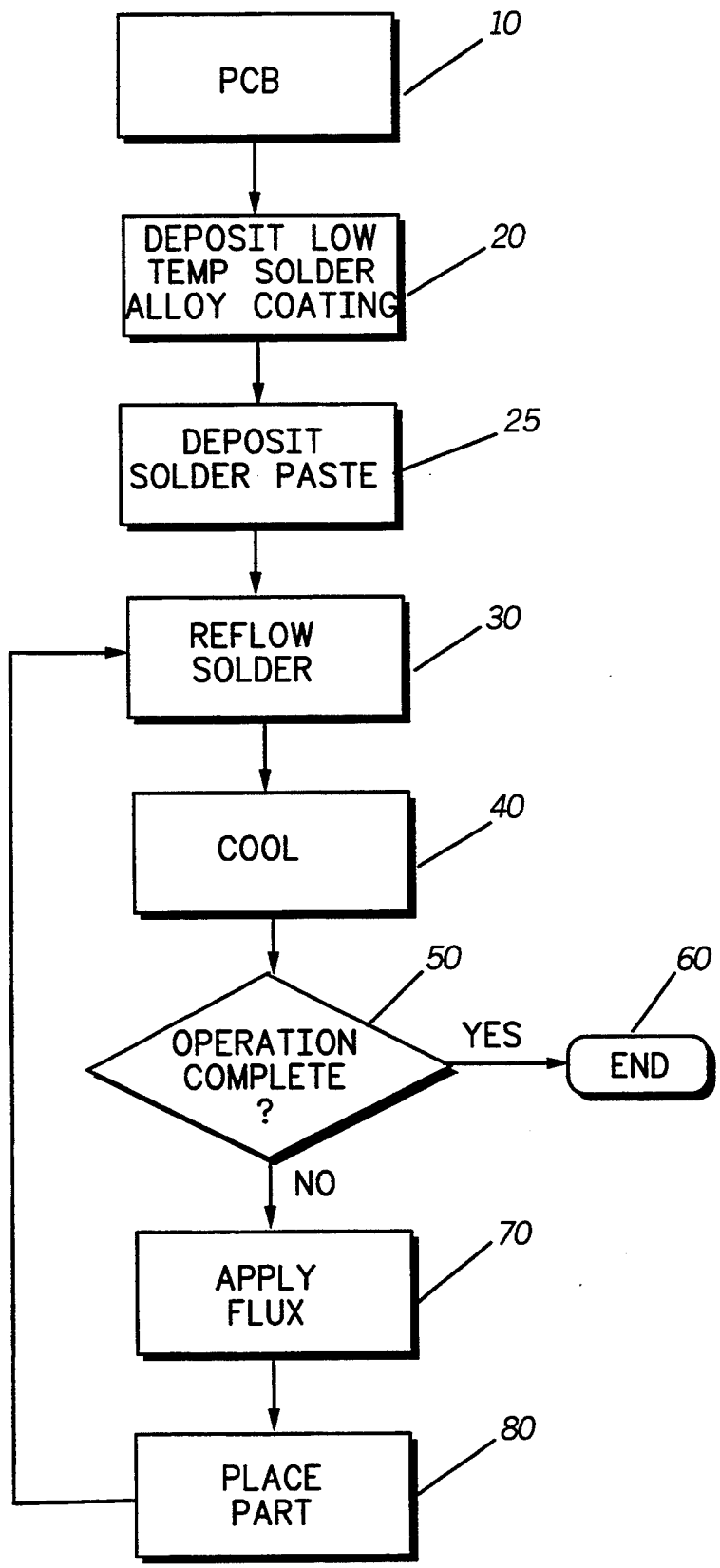
FIG. 1 is a flow chart showing the steps involved in the soldering process in accordance with the invention.

While the specification concludes with claims defining the features of the invention that are regarded as novel, it is believed that the invention will be better understood from a consideration of the following description in conjunction with the drawing figure.

Most solders are alloys of tin and lead. Pure lead melts at 327° C. and pure tin melts at 232° C. When these two metals are alloyed, the alloy has a lower melting point than either of the individual components. Depending upon the percentage composition of the tin and lead, the melting point will vary. However, there is one alloy having a composition of 63% tin and 37% lead, known as the eutectic composition, that has the lowest melting point (183° C.) of any of the possible mixtures. This eutectic composition has the characteristic of having a sharp and distinct melting point precisely at this temperature. That is, the solder alloy undergoes a phase change from solid to liquid at this point. All other compositions of tin and lead, other than the eutectic, are mixtures which do not melt sharply at any one temperature, but which pass through an intermediate range of plasticity in cooling from the liquid to the solid state.

These various alloys that pass through an intermediate range of plasticity are said to have a melting range. At temperatures above the melting range, the alloy is a liquid. Below the melting range, the alloy is a solid. However, at temperatures within the melting range, it is a plastic-like material that cannot be defined strictly as a liquid nor as a solid. The lower temperature of the melting range is known as the solidus temperature, and the upper temperature of the melting range is known as the liquidus temperature. At temperatures below the solidus temperature, the alloy is a solid, and at temperatures above the liquidus temperature, the alloy is a liquid. Materials other than tin and lead may be added to the alloy and will cause similar types of behavior. Examples of some materials are aluminum, antimony, arsenic, bismuth, cadmium, copper, indium, iron, nickel, silver, and zinc. Because many solder alloys exhibit a melting range rather than a pure melting point, a great deal of confusion exists over exactly what point may be considered to be the melting point of solder. For purposes of this invention, the melting point of a solder is considered to be that point at which the alloy transitions from a solid either to a liquid or to a plastic type composition; that is the melting point may be considered to be equivalent to the lower end of the melting range, or the solidus point.

This invention provides a substantially flat solder surface on the solderable portions of a printed circuit board, and can be used in both single-sided and double-sided printed circuit assemblies. It improves the quality of electronic assemblies made using automated placement systems. Typically, the manufacturer of the printed circuit board adds the solder to the printed and etched board during the fabrication process. In the preferred embodiment of the invention, a soldering method uses a solder coating that is applied to the solderable surfaces of the printed circuit board, and a solder paste that is printed on the solder coating. Each of the alloys has a melting point or range that is unique from the other. In the preferred embodiment of the invention, the metallic portion of the solder paste consists of a tin-lead-silver alloy (melting point 179°–181° C.), and the solder coating is a tin-lead-bismuth alloy (melting range 144° C.–163° C.). The tin-lead-silver alloy is about 62% tin, 36% lead, and 2% silver, whereas the tin-lead-bismuth alloy is about 43% tin, 43% lead, and 14% bismuth. The solder alloy in the solder paste is in the form of finely divided particles (such as spheres or irregularly shaped particles), typically in the size range of 200–500 mesh. These particles are frequently referred to as 'solder powder'. The powder is typically suspended in a matrix of a vehicle and a fluxing agent, to aid in the printing and reflow processes. The tin-lead-bismuth solder alloy is referred to as the low temperature alloy, and the tin-lead-silver alloy is referred to as the high temperature alloy, since its melting range is above the other alloy. Although the preferred embodiment employs two solder alloys, three or more distinct alloys, for example, could be used and still be considered to be within the spirit and scope of the invention. In addition, the ratios or amounts of each alloy could also be modified depending on the metallurgical composition of each material, or pure forms of metal could be used instead of alloys. In other embodiments, alloys of elements such as tin, lead, bismuth, indium, copper, antimony, cadmium, arsenic, aluminum, gallium, gold, silver may also be used.

Figure 2:
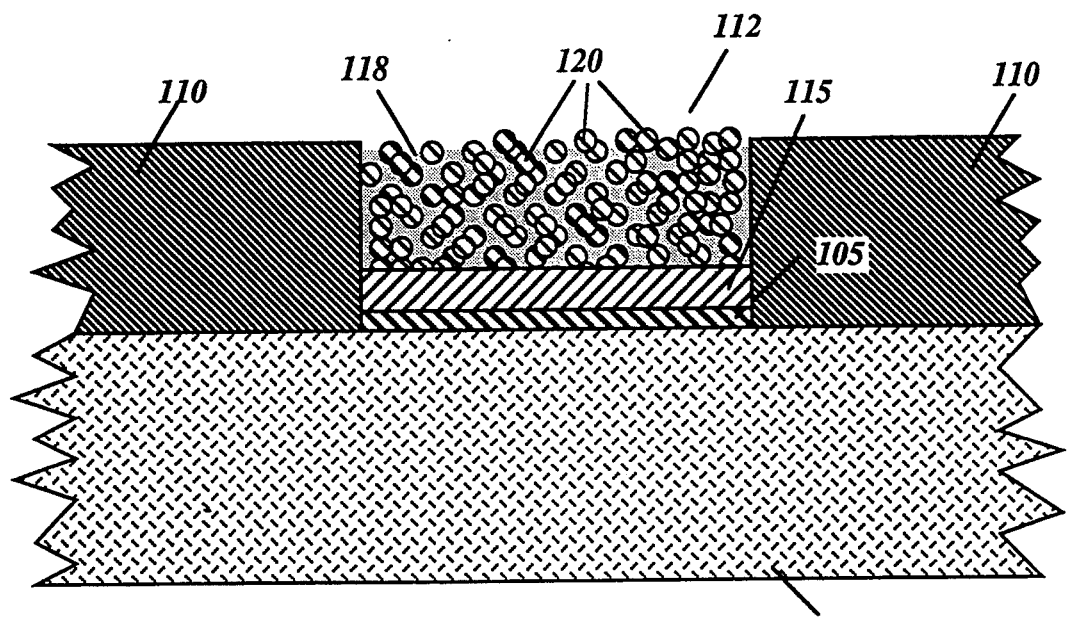
FIG. 2 is a cross sectional view of a circuit carrying substrate prior to heating, in accordance with the invention.
Figure 3:
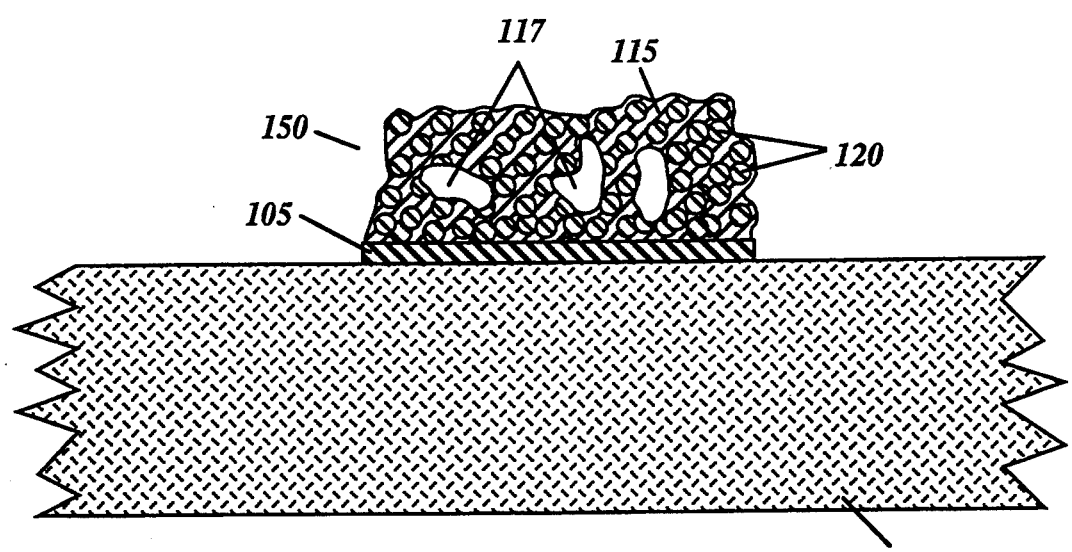
FIG. 3 is a cross sectional view of a circuit carrying substrate after a first heating step, in accordance with the invention.

Reference is now concurrently made to the process flow diagram, FIG. 1, and a cross sectional view of the printed circuit board, FIG. 2. An insulating substrate such as a printed circuit board 100 (PCB) having a solderable surface 105 is provided, as shown in box 10. The printed circuit board 100 is then coated with the low temperature solder alloy, as shown in box 20. The process of coating may be performed in several different ways, all familiar to those skilled in the art. These include coating by hot air solder leveling (HASL), electroless plating, electroplating, evaporation, sputtering, or other techniques. The solder paste, containing high temperature particles 120 and additional components 118 such as fluxes or vehicles, is deposited on the layer of low temperature solder. In the preferred embodiment, a mask 110 having appropriately located openings 112 is placed on the PCB 100 so that the coated solder 115 is exposed. The mask 110 is temporary, such as a stencil or a screen mesh typically used for printing solder paste. The paste is printed through the openings 112 in the mask using a squeegee. After printing, the mask 110 is removed and the low temperature solder coating is reflowed (box 30), resulting in the structure as shown in FIG. 3. During the reflow, the PCB and solder paste are heated to a temperature such that the low temperature solder alloy 115 is melted or liquified, but the high temperature alloy 120 remains in its original and unmelted, solid state. Note that the coating of low temperature solder 115 has flowed and wet to the solder particles, and is no longer in a uniform layer. In the preferred embodiment the peak reflow temperature would be about 165° C. At this temperature, only the low temperature solder alloy liquefies. The higher temperature solder spheres remain intact and, upon cooling (box 40) below its melt temperature, the low temperature solder alloy solidifies. This process of partially melting the mixture creates a solid solder mass having a substantially flat, textured surface. When the end product of the method is a printed circuit substrate, the operation is complete (boxes 50 and 60). At this point, the PCB 100 is clad with a thick, but uniform and flat layer of solder 150 on the solder pads 105. This layer of solder 150 consists of an aggregate-like structure of the unreflowed high temperature solder alloy particles 120 distributed within a matrix of the reflowed or melted low temperature solder alloy 115. The low temperature alloy 115 serves to 'bind' the unmelted high temperature alloy particles 120 together to form a single mass. In practice, some voids or empty spaces 117 may be formed in the solder mass upon cooling. These voids 117 are the result of inefficiencies in the packing of the solder particles and/or the volatiles evolved from the flux and vehicle during the heating process.

Although the exact mechanism taking place during the reflow process is not completely understood, it is postulated that the low temperature material has wet to the PCB and the high temperature solder material, alloying to form a metallurgical bond, thereby adding to the mechanical integrity of the resulting solder mass. The formation of the metallurgical bond is thought to occur by diffusion between the molten metal alloy and the solid metal during reflow.

Further operations may be performed with the solder clad PCB. For example, it may now be used in an assembly process similar to that used with conventional clad solid solder deposition printed circuit boards; that is, the surface is fluxed, as shown in box 70, and surface-mount components or parts are placed (box 80) at the desired locations with the solderable portions of the parts in contact with the reflowed soldering composition on the printed circuit board. Prior to placement of the parts on the circuit board, a solder flux or tacking agent may optionally be used. This solder flux or tacking agent is typically applied at selected locations in order to aid in fixturing the electronic components and also to aid in removing oxides from the solder surfaces. The rough and fiat surface of the reflowed soldering composition aids in keeping the flux from spreading off the pad, and also aids in keeping the part in place on the pad. The flux application step 70 can be performed in any of a number of ways, such as spraying, roller coating, syringe dispensing, pin transfer mechanisms, and so forth, all known to those in the art. The parts are placed as shown in step 80, and the assembly is now reflowed at a temperature sufficient to reflow both the low temperature solder alloy and the high temperature solder alloy. This forms a solder fillet between the solderable portions of the component and the solderable portions of the printed circuit board. This reflow step is represented by box 30. As the temperature passes above 144° C., the low temperature alloy melts and as the temperature exceeds 180° C., the high temperature alloy also melts. The liquid alloys create substantial surface tension to provide self-centering of the surface mount components. At this point, the single sided assembly would be complete.

Figure 4:
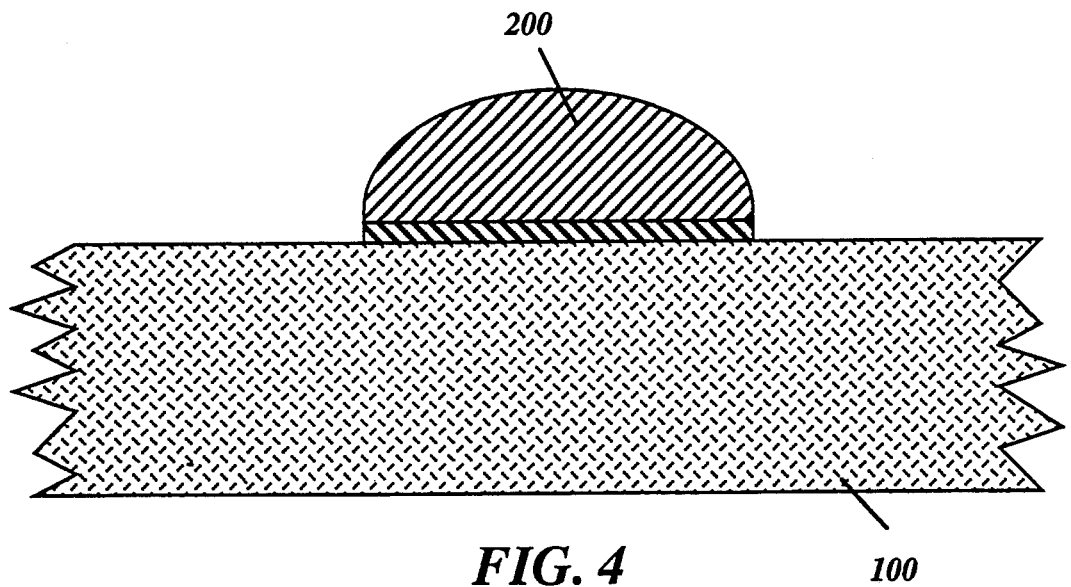
FIG. 4 is a cross sectional view of a circuit carrying substrate after a second heating step, in accordance with the invention.

However, if additional parts are required to be placed on the circuit board, either on the same side or on the opposite side of the circuit board, another assembly operation occurs. In this case, a solder paste having still another composition can be used. In this case, the solder alloy would have different melting ranges. Preferably, the alloy(s) would have melting ranges or melting temperatures higher than those used in the first reflow operation. This soldering composition could be a single alloy, as is employed in conventional soldering processes, or it could be a dual alloy mixture using the same concept as explained above. After the reflow step for part placement 30, the board is again cooled down 40, and a soldering flux or tacking agent 70 is applied. The parts 80 are placed in conventional manner either manually or by robots or automated placement machines, and the assembly is again reflowed. Multiple reflows are commonly performed in today's high-density, complex electronic assemblies. Referring now to FIG. 4, during the high temperature reflow, both the low and high temperature materials melt to form a third alloy 200 that is essentially uniform throughout.

Figure 5:
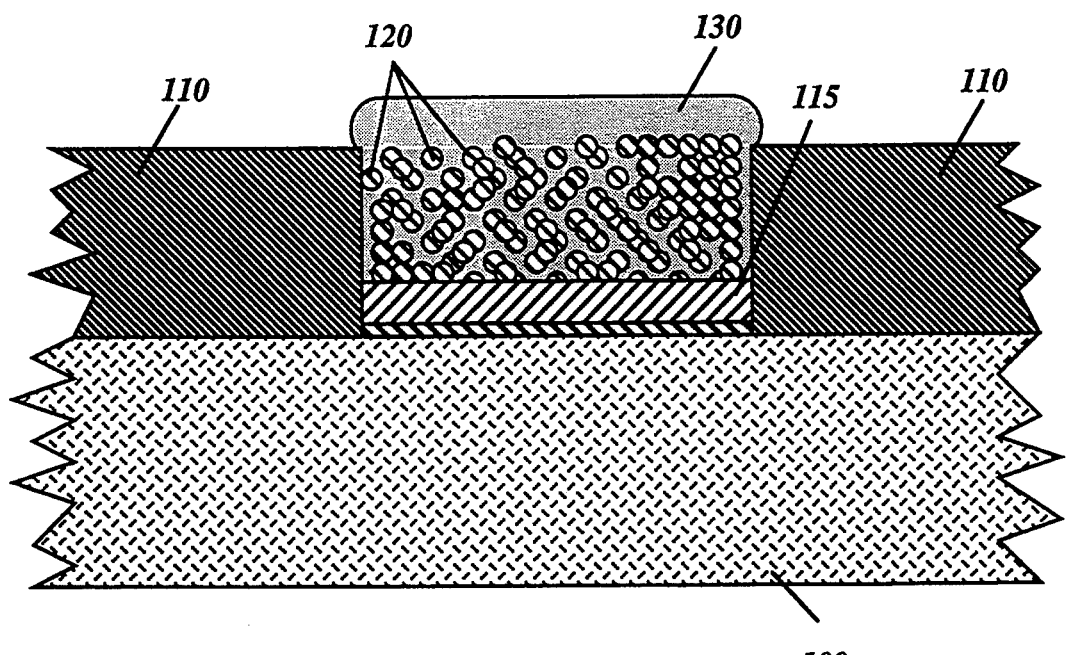
FIG. 5 is an alternate embodiment cross sectional view of a circuit carrying substrate prior to heating, in accordance with the invention.

Rather than using a solder paste having a vehicle and other components such as fluxes, solder particles can simply be deposited on the solderable pads 105. As shown in FIG. 5, a mixture consisting of just the particles of the high temperature solder alloy 120 are deposited in the openings of the mask 110. This eliminates the need for expensive solder paste, and permits the use of the solder powders. The deposition process can be by spraying, curtain coating or other means, and the excess can be easily wiped off the surface of the mask 110. Before the low temperature material 115 is melted, a fluxing agent 130 is applied over the deposited solder powder to aid in removing any oxides and promote wetting. After the reflow step where only the low temperature material is melted, the resulting structure resembles that shown in FIG. 3.

Clearly, it can be seen that this invention provides the advantage of the creation of fiat, uniformly rough surfaces on the solderable portions of a printed circuit board due to the presence of unmelted particles of solder in the reflowed low-melting alloy. This creates a surface that is highly suitable for retention of any flux or tacking agent dispensed on the pad, whereas the domed surfaces found in conventional solder clad or reflowed PCBs are prone to flux loss by rolling or flowing off of the domed surfaces. Further, the fiat surfaces of the solder provide better quality in the surface mounted component placement process, as the components do not slide off of the fiat solder pads. Surface tension provided during the reflow operation also aids in self-centering the part on the pad. It can also be seen that this invention may be used to provide a solder clad printed circuit board or other type of substrate, and may further be used to provide an assembly process for assembling and soldering printed circuit assemblies soldering electronic components to the board, resulting in printed circuit assemblies.

While the preferred embodiments of the invention have been illustrated and described, it will be clear that the invention is not so limited. For example, the soldering composition could be provided on the nonsolderable portions of the substrate, so that after reflow, the soldering composition 150 does not adhere to the substrate. Numerous other modifications, changes, variations, substitutions and equivalents will occur to those skilled in the art without departing from the spirit and scope of the present invention as defined by the appended claims.

We claim:

1. A soldering method, comprising the steps of:
   a) providing a coating of a first solder material having a liquidus temperature on solderable portions of a printed circuit board;
   b) depositing a solder paste on the first solder material, said solder paste having a solidus temperature that is greater than the liquidus temperature of the first solder material;
   c) heating the solder paste and the first solder material to a temperature that is above the liquidus temperature of the first solder material and below the solidus temperature of the solder paste, thereby dispersing the first solder material throughout the solder paste and alloying the first solder material to the solder paste and the solderable portions of the printed circuit board; and d) cooling the solder paste and the first solder material to a temperature below the liquidus temperature of the first solder material, to form a solid and substantially planar coating of the first solder material uniformly dispersed throughout the solder paste on the solderable portions of the printed circuit board.

2. The method of claim 1, wherein the step of depositing a solder paste comprises depositing a solder paste comprising an alloy of tin, lead and silver, and having a melting temperature of about 180° C.

3. The method of claim 1, wherein the step of providing a coating comprises depositing a solder alloy having a melting temperature less than 180° C.

4. The method of claim 1, further comprising a final step of:

e) soldering an electronic component to the substantially planar coating on the solderable surfaces, at a temperature sufficient to cause said solder paste to reflow.

5. The method of claim 4, further comprising a step of applying flux on said substantially planar coating prior to soldering said component.

6. The method of claim 1, wherein the step of providing a coating comprises depositing an indium solder alloy.

7. The method of claim 1, wherein the step of providing a solder paste includes solder particles comprising about 12% by weight of the first solder particles and about 88% by weight of the second solder particles.

8. The method of claim 1, wherein the step of providing a coating comprises plating the first solder material on the solderable portions of the printed circuit board.

9. The method of claim 1, wherein the step of providing a coating comprises hot air leveling the first solder material on the solderable portions of the printed circuit board.

* * * * *